United States Patent [19]
Goffer et al.

[11] Patent Number: 5,573,000
[45] Date of Patent: Nov. 12, 1996

[54] RADIO-FREQUENCY INTERFERENCE SHIELD IN MRI SYSTEMS

[75] Inventors: Amit Goffer, Kiryat Tivion; Yuval Tzuk, Haifa, both of Israel

[73] Assignee: Elscint Ltd., Haifa, Israel

[21] Appl. No.: 384,464

[22] Filed: Feb. 2, 1995

Related U.S. Application Data

[63] Continuation of Ser. No. 151,874, Nov. 15, 1993, abandoned.

[30] Foreign Application Priority Data

Nov. 17, 1992 [IL] Israel ............................ 103769

[51] Int. Cl.⁶ .................................. A61B 5/055
[52] U.S. Cl. ........................ 128/653.2; 324/318

[58] Field of Search ............... 128/653.2, 653.5; 324/309, 318, 322

[56] References Cited

U.S. PATENT DOCUMENTS

| Re. 33,505 | 12/1990 | Vinegar et al. | 128/653.2 |
| 4,564,812 | 1/1986 | Van Dijk | 324/318 |
| 4,613,820 | 9/1986 | Edelstein et al. | 324/318 |

*Primary Examiner*—Marvin M. Lateef
*Assistant Examiner*—Brian L. Casler
*Attorney, Agent, or Firm*—Greenblum & Bernstein, P.L.C.

[57] ABSTRACT

Radio frequency interference (RFI) shielding for use with magnetic resonance imaging (MRI) systems wherein the magnet of the system is coupled to the shielding to form an integral part thereof.

9 Claims, 3 Drawing Sheets

RADIO-FREQUENCY INTERFERENCE SHIELD IN MRI SYSTEMS

This application is a continuation of application No. 08/151,874, filed Nov. 15, 1993, now abandoned.

FIELD OF THE INVENTION

This invention is concerned with magnetic resonance imaging (MRI) systems and more particularly with radio frequency interference (hereinafter sometimes "RFI") shielding used in such MRI systems.

BACKGROUND OF THE INVENTION

A typical MRI system contains a large magnet having a bore therein for receiving patients to be imaged. The magnet, within the scope of this invention, could either be superconductive, resistive, or a permanent magnet. The typical system also includes gradient coils for varying the magnetic field in a known manner. Radio frequency (RF) coils are also provided within the magnet for "tipping" spins in the patient in order to generate the RF signal data used for producing images. Assoicated with the coils are gradient amplifiers and RF transmitters, receivers and signal processing systems.

The signals received responsive to the RF signal transmitted by the RF coils are extremely small. Therefore, MRI systems have a very low signal-to-noise (SNR) ratio. Especially because of the extremely low SNR, even the smallest amount of radio frequency interference affects the images adversely.

The radio frequency interference can penetrate shielded systems through the gradient cables by conduction and radiation. The source of the RF noise can be the gradient amplifiers and/or any other RF transmission, not necessarily related to the MRI system. In the latter case, the gradient cables operate as antennae; i.e., the radiated RF noise is received by the cables and conducted to the system. The RF noise, conducted through the gradient cables, is coupled from the gradient coils to the RF coils even when there is a decoupling RF mesh between the RF coils and the gradient coils, due to the limited capabilities of the RF mesh.

The above RFI penetration scenario is not the only possible one, and RF noise can be conducted into the vicinity of the RF coils through any other cables going into and out from an RF cage.

To prevent the RFI, it is typical to close the complete magnet system into an RFI shielded room. Such a room is ideally enclosed throughout by the use of walls, floors and ceilings that are covered with copper plating, for example. Where there is no room for a completely shielded room, then other forms of a Faraday cage are often used. These are often made up of a combination of copper plates and a copper mesh which completely surrounds the sensitive RF coil area, including the patient. This arrangement is often referred to as an RF cage. Then, the RF coils are within confines of an RFI cage and the magnet and gradient coils are outside of the confines of the RF cage.

Oft-times, part of the mesh serves as the RF coils to gradient coils decoupling device.

With the shielded room, the sensitive areas are surrounded by conductive surfaces; i.e., the RF cage. Currents that are induced by the external RFI electromagnetic fields are on the surface of the conductive cage. The induced currents produce electromagnetic fields which cancel the external RF fields inside the cage; thereby protecting whatever is in the interior of the cage from the external RF field.

Where RF cages or RF rooms are used, cables going into and from the cage are connected via feedthrough filters. There are commonly a few configurations of feedthrough filters such as, for example: L-type, T-type and x-type depending on the loading on each side of the specific cable. Basically, a feedthrough filter introduces high serial throughput impedance and low parallel impedance to the shield thus preventing the conductance of the interference through the shield.

It has been found that the abovesaid RF cage generally does not provide sufficient shielding due to the low signal provided by MRI systems and the signal's susceptibility to radio frequency interference noises.

Thus, those skilled in the art are still searching for an effective RF shield where there is insufficient room for a radio frequency interference-type room enclosed by copper plates.

BRIEF DESCRIPTION OF THE INVENTION

In a preferred aspect of the present invention, the magnet is connected to shielding to form an integral part of the shield. Where the magnet is a superconducting magnet then preferably the outer vacuum cylinder is what is connected to the other parts of the cage to form a continuous of conducting surfaces to create a unique Farraday cage for preventing RF interference.

In accordance with another preferred aspect of the present invention, the decoupling mesh or device between the RF coil and the gradient coils is also connected to the magnet to provide approximately double the RFI shielding. Thus, the invention provides an inexpensive efficient and effective RFI shield.

A more detailed aspect of the present invention comprises a magnetic resonance imaging system having efficient shielding to minimize radio frequency interference, said system comprises:

a magnet for creating a large static magnetic field, said magnetic having a bore therein for receiving a patient for imaging, gradient coils for selectively varying the magnetic field, radio frequency coils to produce RF signals in said magnet at desired resonance frequencies to generate image data, a radio frequency shield for preventing external RF from contaminating the RF signals transmitted and received within the bore, and said shielding including said magnet.

A further aspect of the present invention comprises a magnetic resonance imaging system having efficient shielding to minimize radio frequency interference, said system comprising:

a magnet for creating a magnetic field within a bore of the magnet, said bore being of sufficient dimensions to receive a patient therein for imaging purposes, gradient coils for selectively varying the magnetic field, radio frequency (RF) coils to produce radio frequency signals in said magnet at desired resonance frequencies to generate image data, an RF mesh or other device such as, but not limited to, a slotted copper cylinder, or decoupling said coils for decoupling RF coils from said gradient coils, an RF shield for preventing external RF from contaminating the RF signals within the bore, and said shield including said magnet and said mesh shield.

BRIEF DESCRIPTION OF THE DRAWINGS

The above named and other features and objects of the present invention will be best understood upon reading the following detailed description of preferred aspects of the present invention in conjunction with the attached drawings, in which.

DETAILED DESCRIPTION OF THE INVENTION

Figure 1:
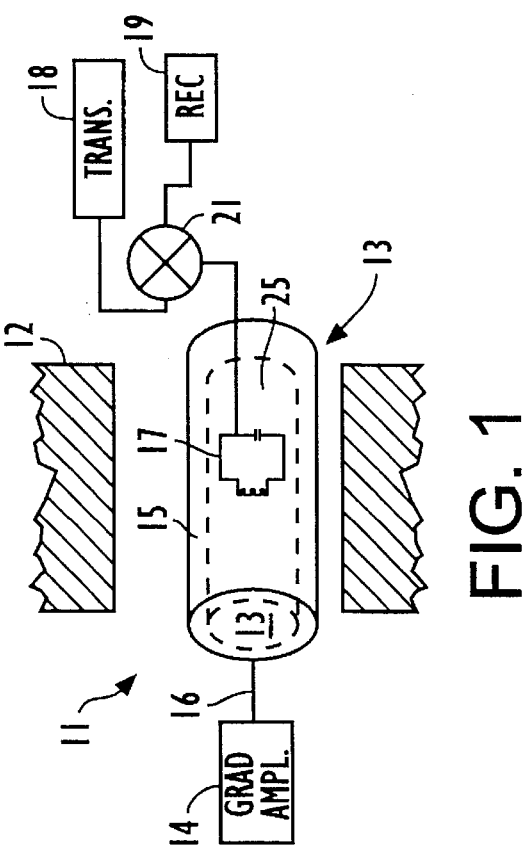
FIG. 1 is a schematic block diagram representation of an MRI system.

As shown in FIG. 1, MRI system 11 typically comprises a large magnet 12 for generating a large static magnetic field. The magnet 12 has a bore 13 large enough to receive a patient therein. In the drawing of FIG. 1 there is also shown a gradient amplifier 14 which is used to provide power to gradient coils 15 within the magnet. The gradient coils 15 in the magnet are adjacent to the bore and are illustrated in FIG. 1 by a cylinder to which they are confined. The gradient coils are used to selectively vary the magnetic field. As is well known, the magnetic field aligns "spins" in the subject being imaged. The variation in the magnetic field is provided by the gradient amplifiers and coils there being one for each of the X, Y and Z orthogonal coordinates of the MRI system. However, cables going from the gradient amplifier to the magnet are indicated at 16. As close as possible to the bore, a radio frequency coil is provided. This is schematically shown at 17 in FIG. 1.

The patient is subjected to radio frequency pulses generated in the transmitter indicated at 18. The pulses are applied to the RF coils causing the spins to "tip" from their aligned position to have at least a projection in an orthogonal plane to subsequently generate RF signals. The RF signals are also received generally by the same RF coil or a different RF coil and transmitted to the receiver 19. A multiplexer type arrangement designated at 21 is used to selectively provide either the transmitted signals to the RF coil or transmit the received signals to receiver 19.

A mesh 25 indicated by the dashed lines within the bore 22 is located just within the bore of the magnet and is designed to decouple the RF coil from the gradient coils.

Figure 2:
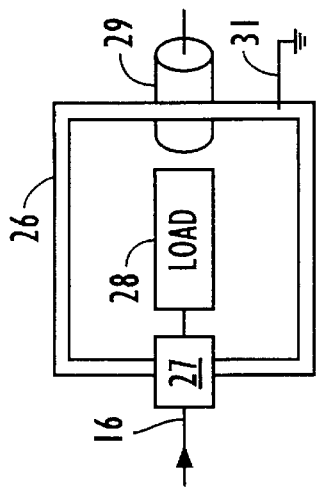
FIG. 2 shows a typical RFI shielding cage of the prior art.

Preferably, the magnet and magnet resonance system including the RF coils and gradient coils are enclosed within an RF interference shielding cage such as shown in FIG. 2. Therein, highly conductive plates on the walls, ceiling and floor are provided. The walls of the cage are shown in FIG. 2 and indicated at 26. It should be understood that preferably the walls are made of plates of copper sheeting. The floor and the ceiling are also encased in copper plates so that the entire room is surrounded and enclosed by the copper plating.

The cable, such as the gradient cable 16, is shown as entering the enclosed portion of the cage through a feedthrough filter 27. The load indicated at 28, is in the particular case of interest herein, the gradient coils. Similarly, the RF cables going from the transmitter and receiver to the RF coil pass through a coaxial feedthrough connector 29 which is designed to prevent RF radiation. The copperplated conductors are all connected together in a wall known manner and finally grounded by a wire going to ground from the plates shown at 31.

Figure 3:
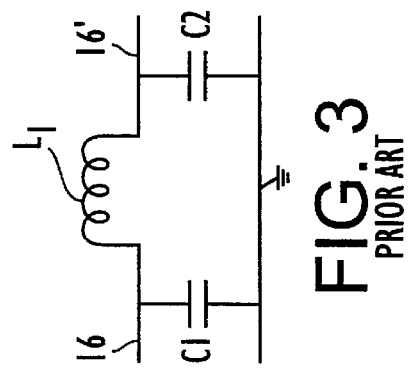
FIG. 3 shows a x-type feedthrough filter.

A typical feedthrough filter is shown in FIG. 3. This is the x-type filter wherein the cable 16 is connected in series with a coil L1 to the cable 16' which is within the shielding enclosure and is connected directly to the gradient coils. On each side of the inductor L1, which passes low frequencies and prevents the passage of high frequencies, are the capacitors C1, C2 making up the x-type feedthrough filter. Thus, the x-type feedthrough filter is designed to prevent the passage of radio frequency through the inductor and to pass any radio frequency signals on the cable 16 and 16' to ground through capacitor C1 and C2.

Figure 4:
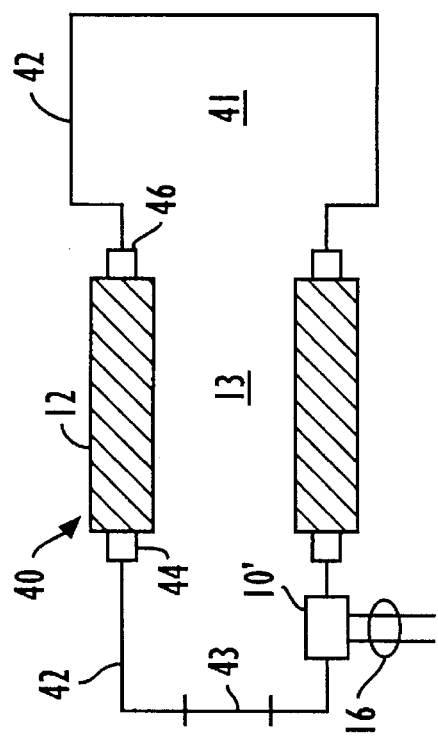
FIG. 4 shows one aspect of the present invention wherein the magnet is attached as an integral part of the RF interference shield.

FIG. 4 at 40 shows a preferred aspect of the present invention. More particularly, there is shown a patient room 41 enclosed in copper sheeting, the wall of which are indicated at 42. The backside of the magnet is also enclosed with copper sheeting 42. However, there is a rear door mesh 43 to enable air and light to enter into the magnetic bore. The gradient cables 16 are supplied through feedthrough filter shown at 10. The system features a shielding arrangement wherein the magnet 12 is made an integral part of the shielding. More particularly, the copper plating is attached to conductive rings 44 and 46 on each side of the magnetic bore. One method of electrically attaching the magnet to the plating is through stainless steel conducting rings welded to each side of the magnet. The feedthrough filter arrangement 10' can include feedthrough filters for other cabling or wiring as required by the system inside the magnet.

Figure 5:
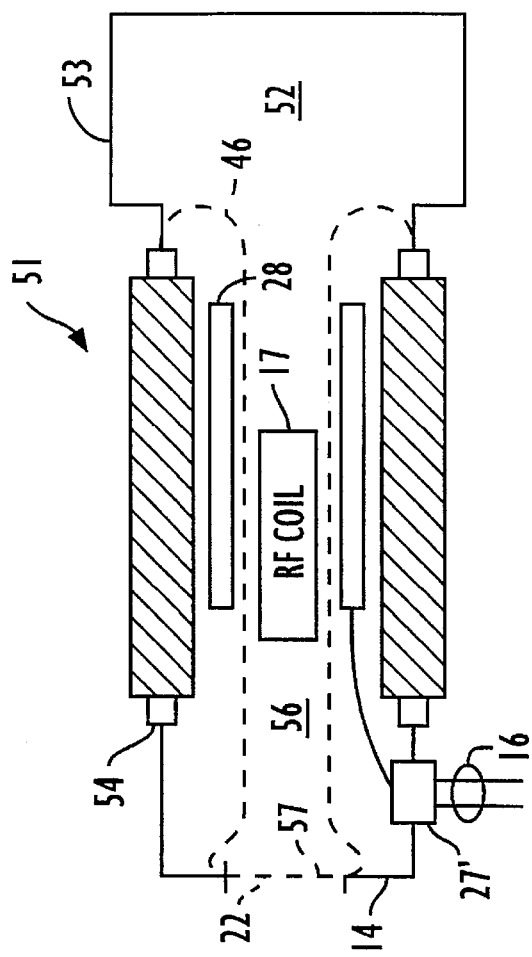
FIG. 5 shows another aspect of the present invention wherein the magnet and the internal decoupling mesh or other device are both parts of the RFI shield.

FIG. 5 shows another embodiment of the present invention. Herein, the system 51 includes the patient's room 52 comprised of walls of copper sheeting 53. It should be noted, of course, that here again both the floors and ceilings are also enclosed with copper sheeting or plating. However, FIG. 5 is a plan view with a cut through of the magnet and thus the ceiling is not shown.

The RF coil 17 is shown as separated from the gradient coil 28 by the mesh 22 or the decoupling device. Mesh 22 is connected to the magnet and to the walls through the ring connector at either the entrance to or the exit from the bore 56. The ring connector at the side opposite the entrnace side of the bore is shown as ring connector 54. Here again a mesh door 57 is shown a the other side of the bore to enable the entrance therethrough of light and air. The feedthrough box 27' is shown through which cables such as gradient cables 16 are fed in FIG. 5.

Figure 6:
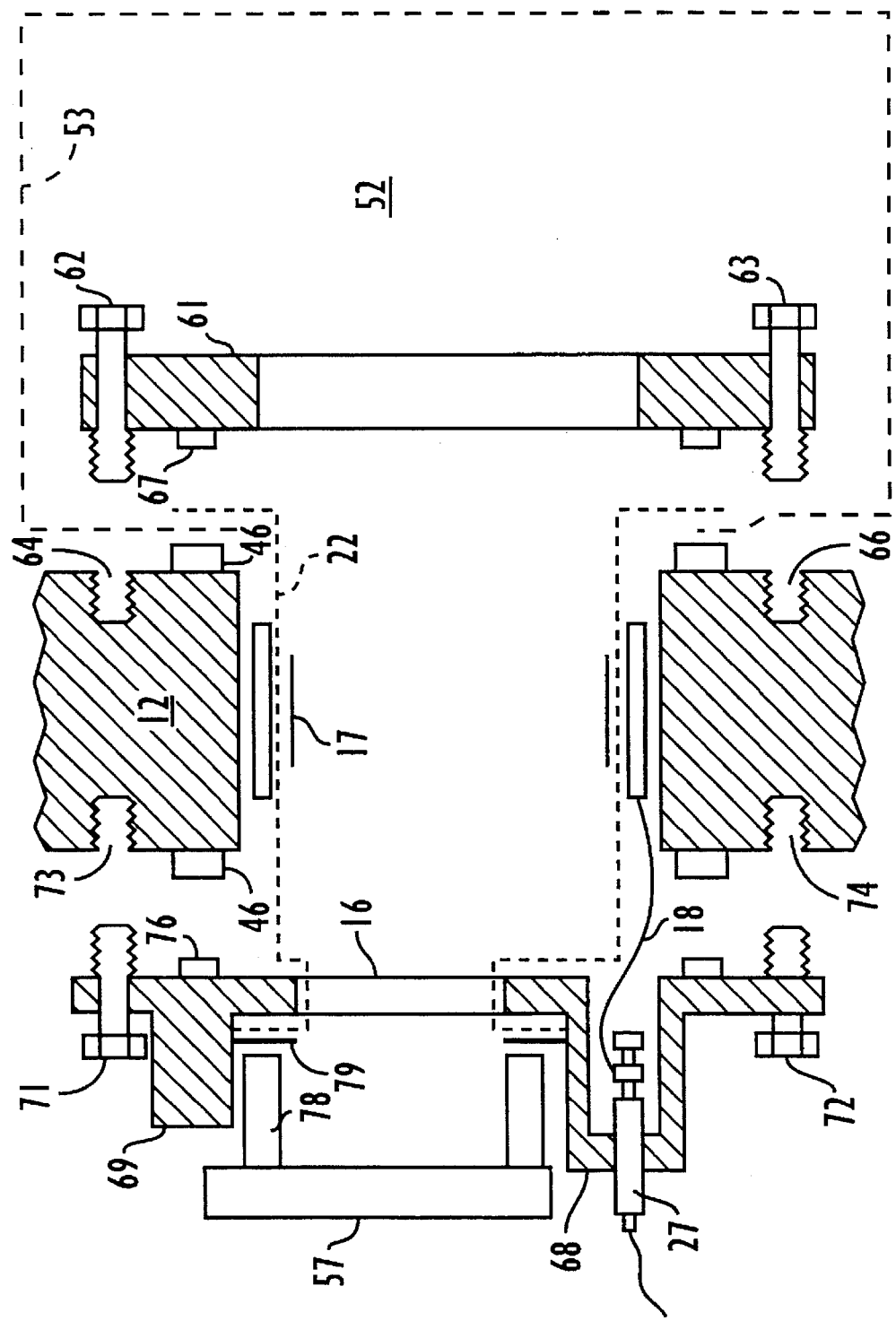
FIG. 6 shows details of the connection of the shielding to the magnet.

Turning to FIG. 6 therein is shown details of the connection of the shield to the magnet. Component numbers as were used in FIG. 5 are used in FIG. 6. The copper shielding 53 surrounding the patient's room 52 is shown placed into contact with the mesh 22 and the stainless steel conducting ring 46 at each side of the bore 16 of the magnet 12. More particularly, both the copper sheet and the mesh are pressed up against the conducting ring, which is preferably of stainless steel, by a frame ring 61. The frame ring is attached to the magnet with fasteners such as threaded fasteners 62 and 63 which fit into threaded aperatures 64 and 66 in the magnet. A gasket 67 presses up against the copper sheets and the copper mesh and the conducting ring 46. The connection to the gradient coil, for example, is brought through a feedthrough box 68 integral to the frame ring 69 connected at the other side of magnet 12 with rubber fasteners 71 and 72 fitting into threaded apertures 73 and 74, respectively. Here again, a gasket 76 seals interior of the magnet when the frame ring is attached to the magnet with the fasteners. A rear door 57 made up of copper mesh is press fitted onto the ring with the copper pressure ring 78. The door 57 presses against a copper ring 79 onto frame ring 69. Frame ring 69 is plated with copper and gasket 76 is made of a conductive material. The copper ring in turn presses agains the mesh 22 and thereby assures a conducting connection between the mesh and the frame ring 69. There is a good connection between the magnet and the frame ring accomplished both through the threaded fasteners and through the sealing gasket 76 pressed up against the stainless steel ring 46. Stainless steel ring 46 is slotted to the magnet 12. The conductor 18 coupled to the gradient coil is fed through a filter arrangment 27 which passes through the feedthrough box 68. The RF coil 17 is schematically shown in the drawing of FIG. 6.

Thus FIG. 6 shows a preferred embodiment wherein copper plating, a copper mesh and the magnet itself are all used to accomplish shielding for minimizing radio frequency-interference in MRI studies.

Although the invention has been described in terms of specific embodiments, and applications, those skilled in the art can in the light of this teaching generate additional embodiments and applications without exceeding the scope or departing from the spirit of the claimed invention.

Accordingly, it is to be understood that the drawings and description in this disclosure are preferred to facilitate comprehension of the invention and should not be construed to limit the scope thereof.

What is claimed is:

1. A magnetic resonance imaging system, said system comprising:

a magnet for creating a magnetic field, said magnet having a bore therein for receiving patients for imaging, said bore having a front opening and a rear opening, gradient coils for selectively varying the magnetic field, radio-frequency (RF) coils to produce RF signals in the bore of said magnet at desired radio frequencies to generate image data, RF shielding for prevent external RF signals from contaminating the RF signals in the bore, and said RF shielding including a first RF shield external to said magnet, and special conductive elements for electrically coupling said first RF shield to said magnet to include said magnet as an integral part of the RF shielding so that said RF shielding comprises the magnet conductively coupled to said first RF shield.

2. The magnetic resonance imaging system of claim 1 wherein said RF shielding includes in addition to the first RF shield, a second RF shield being electrically connected to the magnet through said special conductive elements, said second RF shield being located within the magnet bore between the gradient coils and the RF coil.

3. The magnetic resonance imaging system of claim 2 wherein said system includes a patient room, said patient room being surrounded by said first RF shield, said special conductive elements electrically connecting the first RF shield surrounding the patient room to the magnet and to the second RF shield within the bore of the magnet between the gradient coils and the RF coil.

4. The magnetic resonance imaging system of claim 3 wherein said system includes a rear door of shielding material for said magnet, and means for connecting said rear door of shielding material to said second RF shield within the bore of the magnet.

5. The magnetic resonance imaging system of claim 4 wherein the second RF shield within the magnet and the first RF shield surrounding the patient room are copper mesh shielding.

6. The magnetic resonance imaging system of claim 4 wherein the means for electrically connecting the rear door to the second RF shield comprises a rear frame ring surrounding the rear opening, and a copper plate attached to the rear frame ring in a manner that forces the rear door into a contiguous electrically coupled relationship with the second RF shield.

7. The magnetic resonance imaging system of claim 3 wherein the first RF shield surrounding said patient room is comprised of copper sheeting.

8. The magnetic resonance imaging system of claim 3 wherein said special conductive elements include:

a first conductive ring surrounding the front opening of the bore, a second conductive ring surrounding the rear opening of the bore, a front frame ring for mechanical attachment at the front opening of the magnet on the patient room side of the magnet, a first circular gasket on said front frame ring arranged to press overlapping portions of said first and second RF shields together and against the first conductive ring to provide electrical RF shielding connection between the first RF shield, said second RF shield and said magnet, a rear frame ring for mechanical attachment at the rear opening of the magnet, a second circular gasket on said rear frame ring arranged to abut said second conductive ring to provide electrical RF shielding connection between the rear frame ring and the magnet, and an RF conductive rear door arranged to press fit into the rear frame ring making electrical RF connection between said rear door, to said rear frame ring and said second RF shield to complete the RF shielding.

9. The magnetic resonance imaging system of claim 8 wherein said first and said second conductive rings are stainless steel rings.

* * * * *